(12) United States Patent
Tsai et al.

(10) Patent No.: US 8,291,455 B2
(45) Date of Patent: Oct. 16, 2012

(54) BAND CONVERTER AND SATELLITE TELEVISION SYSTEM THEREOF

(75) Inventors: Cho-Jui Tsai, Taipei Hsien (TW);
Chen-Chia Huang, Taipei Hsien (TW)

(73) Assignee: Wistron NeWeb Corporation, Hsi-Chih, Taipei Hsien (TW)

( * ) Notice: Subject to any disclaimer, the term of this patent is extended or adjusted under 35 U.S.C. 154(b) by 618 days.

(21) Appl. No.: 12/574,707

(22) Filed: Oct. 7, 2009

(65) Prior Publication Data
US 2010/0325669 A1    Dec. 23, 2010

(30) Foreign Application Priority Data
Jun. 17, 2009   (TW) .............................. 98120241 A

(51) Int. Cl.
*H04N 7/20* (2006.01)
(52) U.S. Cl. ......................................... 725/68; 455/130
(58) Field of Classification Search .................. 455/130, 455/189.1, 190.1; 725/68, 151
See application file for complete search history.

(56) References Cited

U.S. PATENT DOCUMENTS

| | | | | |
|---|---|---|---|---|
| 6,069,580 A * | 5/2000 | Martinson | ........................ | 342/20 |
| 6,127,962 A * | 10/2000 | Martinson | ........................ | 342/20 |
| 7,265,792 B2 * | 9/2007 | Favrat et al. | .................. | 348/554 |
| 2004/0014435 A1 * | 1/2004 | Woo et al. | ...................... | 455/103 |
| 2004/0257479 A1 * | 12/2004 | Su | .................................. | 348/731 |
| 2007/0089142 A1 | 4/2007 | Norin et al. | | |

* cited by examiner

*Primary Examiner* — Ngoc Vu
(74) *Attorney, Agent, or Firm* — Winston Hsu; Scott Margo

(57) ABSTRACT

A band converter consists of a band-pass filter, a band-stop filter, a first power distributor, a local oscillator, a mixer, a switch circuit, a high-pass filter, a second power distributor, and a low-pass filter. The band-pass filter and the band-stop filter respectively filter a down-converted input signal to generate a first filtered signal and a second filtered signal. The first power distributor is coupled to the band-stop filter. The mixer is coupled to the first power distributor and the local oscillator. The switch circuit is coupled to the first power distributor and the mixer. The high-pass filter is coupled to the switch circuit. The second power distributor is coupled to the band-pass filter and the high-pass filter. The low-pass filter is coupled to the second power distributor.

20 Claims, 7 Drawing Sheets

BAND CONVERTER AND SATELLITE TELEVISION SYSTEM THEREOF

BACKGROUND OF THE INVENTION

1. Field of the Invention

The present invention relates to a band converter and a related satellite television system, and more particularly, to a band converter and a related satellite television system capable of improving signal quality and manufacturing yield rate.

2. Description of the Prior Art

Satellite communication system has characteristics of broadband transmission and wide coverage, so it is widely applied to detection systems, military, telecommunication networks, data, mobile communications, and other fields.

As far as ground users of the satellite communication system are concerned, an antenna, a low-noise block downconverter (LNB), and a demodulator are required to be able to receive a satellite signal. The satellite signal is first received by the antenna, then down-converted into an intermediate frequency (IF) signal via the LNB, and finally demodulated to generate a play signal by the demodulator to be outputted to a user device (e.g., a television).

Please refer to FIG. 1 together with FIG. 2. FIG. 1 is a spectrum diagram of a down-converted satellite signal 100, and FIG. 2 is a diagram illustrating the down-converted satellite signal 100 shown in FIG. 1 processed by a band converter 200. As shown in FIG. 1, the down-converted satellite signal 100 consists of a first data signal DS1 located at a first frequency band FB1, a second data signal DS2 located at a second frequency band FB2, a third data signal DS3 located at a third frequency band FB3, wherein the third frequency band FB3 is higher than the second frequency band FB2, and the second frequency band FB2 is higher than the first frequency band FB1.

A current receiver (e.g. a narrow band receiver 240) is capable of receiving the data signals located at the second frequency band FB2 and the third frequency band FB3 only, and is unable to receive the first data signal DS1 located at the first frequency band FB1. For this reason, a band converter 200 is required to be added in front of the narrow band receiver 240 in order to have an option to receive all of the data signals by stages. As shown in FIG. 2, the band converter 200 can select to output a first output signal 210 or a second output signal 220 to the narrow band receiver 240 through the control of a selecting signal SEL1, wherein the first output signal 210 consists of the second data signal DS2 located at the second frequency band FB2 as well as the third data signal DS3 located at the third frequency band FB3, and the second output signal 220 consists of the second data signal DS2 located at the second frequency band FB2 as well as the up-converted first data signal DS1 located at the third frequency band FB3.

Please refer to FIG. 3. FIG. 3 is a diagram showing an architecture of a traditional B-band converter 300. AS shown in FIG. 3, the B-band converter 300 includes a first power distributor 310, a first high-pass filter HPF1, a second power distributor 320, a band-pass filter BPF1, a low-pass filter LFP1, a mixer 330, a local oscillator 340, a second high-pass filter HPF2, a third power distributor 350, a switch circuit 360, a micro-controller 370, and a second low-pass filter LPF2. From FIG. 3, we can see that the down-converted satellite signal 100 shown in FIG. 1 is received by the B-band converter 300 and is processed by its internal components, wherein the switch circuit 360 is used for selecting to output the first output signal 210 or the second output signal 220 to the back-end narrow band receiver (not shown).

The B-band converter 300 shown in FIG. 3 is an available product in the current market, but its circuit structure is complicated to be implemented. Hence, how to improve signal quality, simplify circuits, and save cost have become an important topic of this field.

SUMMARY OF THE INVENTION

It is one of the objectives of the present invention to provide a band converter and a related satellite television system to solve the abovementioned problems.

The present invention discloses a band converter used for receiving a down-converted input signal. The down-converted input signal has a first data signal located at a first frequency band, a second data signal located at a second frequency band, and a third data signal located at a third frequency band, wherein the third frequency band is higher than the second frequency band, and the second frequency band is higher than the first frequency band. The band converter consists of a band-pass filter, a band-stop filter, a first power distributor, a local oscillator, a mixer, a switch circuit, a high-pass filter, a second power distributor, and a low-pass filter. The band-pass filter performs a band-pass filtering upon the down-converted input signal to generate a first filtered signal, wherein the first filtered signal includes the second data signal located at the second frequency band. The band-stop filter performs a band-stop filtering upon the down-converted input signal to generate a second filtered signal, wherein the second filtered signal includes the first data signal located at the first frequency band as well as the third data signal located at the third frequency band. The first power distributor is coupled to the band-stop filter, for generating a first separation signal and a second separation signal according to the second filtered signal. The local oscillator provides a local oscillating signal. The mixer is coupled to the first power distributor and the local oscillator, for adjusting a frequency of the second separation signal according to the local oscillating signal so as to generate an up-converted second separation signal. The switch circuit is coupled to the first power distributor and the mixer, for selecting one signal from the first separation signal and the up-converted second separation signal according to a selecting signal, and for outputting an output signal. The high-pass filter is coupled to the switch circuit, for performing a high-pass filtering upon the output signal to generate a third filtered signal. The second power distributor is coupled to the band-pass filter and the high-pass filter, for merging the first filtered signal and the third filtered signal to generate a merged signal. The low-pass filter is coupled to the second power distributor, for performing a low-pass filtering upon the merged signal to generate a fourth filtered signal.

The present invention further discloses a band converter used for receiving a down-converted input signal. The down-converted input signal has a first data signal located at a first frequency band, a second data signal located at a second frequency band, and a third data signal located at a third frequency band, wherein the third frequency band is higher than the second frequency band, and the second frequency band is higher than the first frequency band. The band converter consists of a band-pass filter, a band-stop filter, a first power distributor, a local oscillator, a mixer, a switch circuit, a high-pass filter, and a second power distributor. The band-pass filter performs a band-pass filtering upon the down-converted input signal to generate a first filtered signal, wherein the first filtered signal includes the second data signal located at the second frequency band. The band-stop filter performs a band-stop filtering upon the down-converted input signal to generate a second filtered signal, wherein the second filtered signal includes the first data signal located at the first frequency band as well as the third data signal located at the third frequency band. The first power distributor is coupled to the band-stop filter for generating a first separation signal and a second separation signal according to the second filtered signal. The local oscillator provides a local oscillating signal. The mixer is coupled to the first power distributor and the local oscillator for adjusting a frequency of the second separation signal according to the local oscillating signal so as to generate an up-converted second separation signal. The switch circuit is coupled to the first power distributor and the mixer for selecting one signal from the first separation signal and the up-converted second separation signal according to a selecting signal, and for outputting an output signal. The high-pass filter is coupled to the switch circuit, for performing a high-pass filtering upon the output signal to generate a third filtered signal. The second power distributor is coupled to the band-pass filter and the high-pass filter, for merging the first filtered signal and the third filtered signal to generate a merged signal. The band converter is a B-band converter.

The present invention further discloses a satellite television system. The satellite television system includes a low-noise block down-converter, a band converter, and an integrated receiver-decoder. The low-noise block down-converter receives a satellite signal, and down-converts and amplifies it to generate a down-converted satellite signal. The down-converted satellite signal has a first data signal located at a first frequency band, a second data signal located at a second frequency band, and a third data signal located at a third frequency band, wherein the third frequency band is higher than the second frequency band, and the second frequency band is higher than the first frequency band. The band converter is coupled to the low-noise block down-converter, for receiving the down-converted satellite signal. The band converter consists of a band-pass filter, a band-stop filter, a first power distributor, a local oscillator, a mixer, a switch circuit, a high-pass filter, a second power distributor, and a low-pass filter. The band-pass filter performs a band-pass filtering upon the down-converted satellite signal to generate a first filtered signal, wherein the first filtered signal includes the second data signal located at the second frequency band. The band-stop filter performs a band-stop filtering upon the down-converted satellite signal to generate a second filtered signal, wherein the second filtered signal includes the first data signal located at the first frequency band as well as the third data signal located at the third frequency band. The first power distributor is coupled to the band-stop filter for generating a first separation signal and a second separation signal according to the second filtered signal. The local oscillator provides a local oscillating signal. The mixer is coupled to the first power distributor and the local oscillator for adjusting a frequency of the second separation signal according to the local oscillating signal so as to generate an up-converted second separation signal. The switch circuit is coupled to the first power distributor and the mixer for selecting one signal from the first separation signal and the up-converted second separation signal according to a selecting signal, and for outputting an output signal. The high-pass filter is coupled to the switch circuit, for performing a high-pass filtering upon the output signal to generate a third filtered signal. The second power distributor is coupled to the band-pass filter and the high-pass filter, for merging the first filtered signal and the third filtered signal to generate a merged signal. The low-pass filter is coupled to the second power distributor, for performing a low-pass filtering upon the merged signal to generate a fourth filtered signal. The integrated receiver-decoder is coupled to the band converter for receiving the fourth filtered signal and for decoding the fourth filtered signal.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
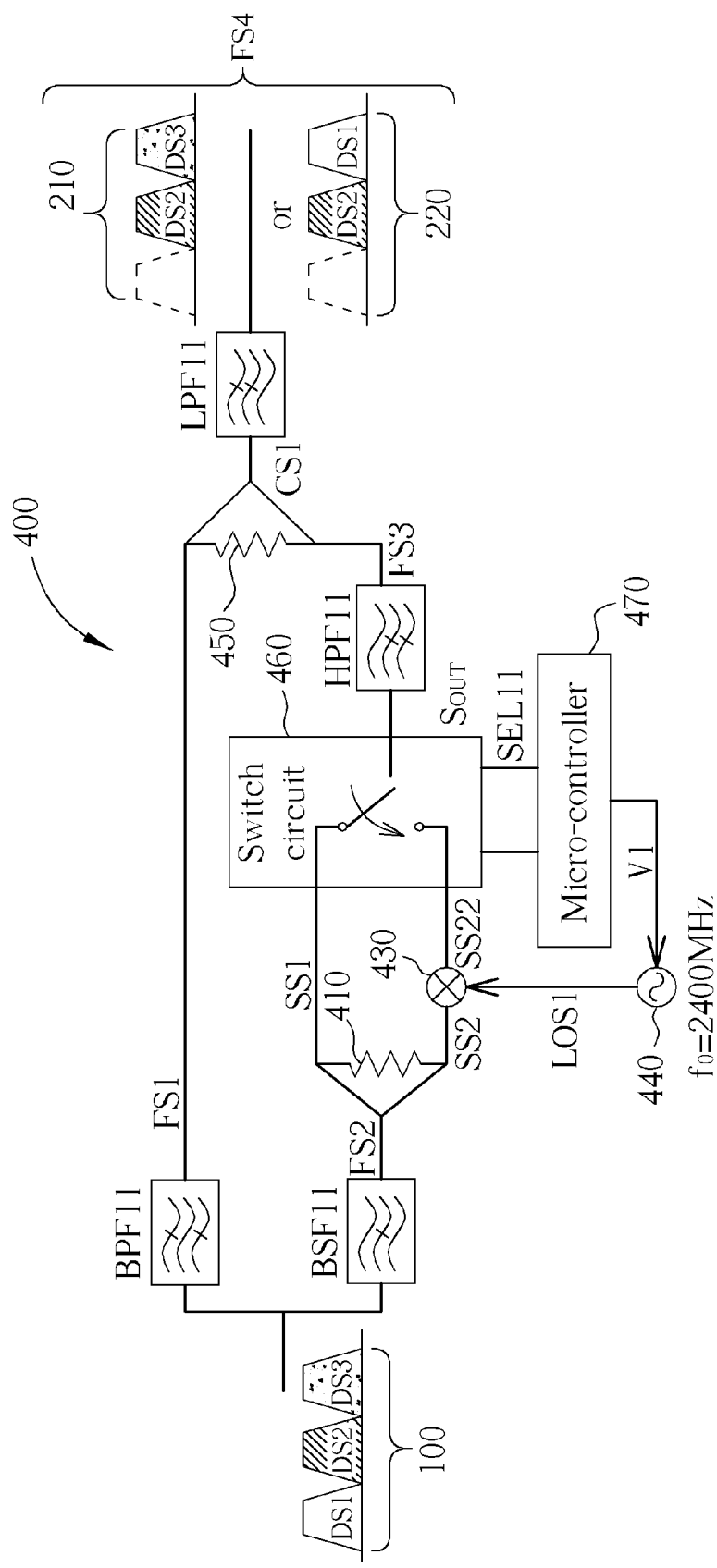
FIG. 4 is a diagram showing an architecture of a band converter according to an embodiment of the present invention.

Please refer to FIG. 4. FIG. 4 is a diagram showing an architecture of a band converter 400 according to an embodiment of the present invention. As shown in FIG. 4, the band converter 400 includes, but is not limited to, a band-pass filter BPF11, a band-stop filter BSF11, a first power distributor 410, a mixer 430, a local oscillator 440, a switch circuit 460, a micro-controller 470, a high-pass filter HPF11, a second power distributor 450, and a low-pass filter LPF11. The band converter 400 is used for receiving a down-converted input signal, such as the down-converted satellite signal 100 shown in FIG. 1. In this embodiment, the first frequency band FB1 falls on 250~750 MHz, the second frequency band FB2 falls on 950~1450 MHz, and the third frequency band FB3 falls on 1650~2150 MHz, but this in no way should be considered as a limitation of the present invention. Please note that the band converter 400 can be applied to a satellite television system. But the present invention is not limited to this only, and the band converter 400 can be applied to other products.

Figure 5:
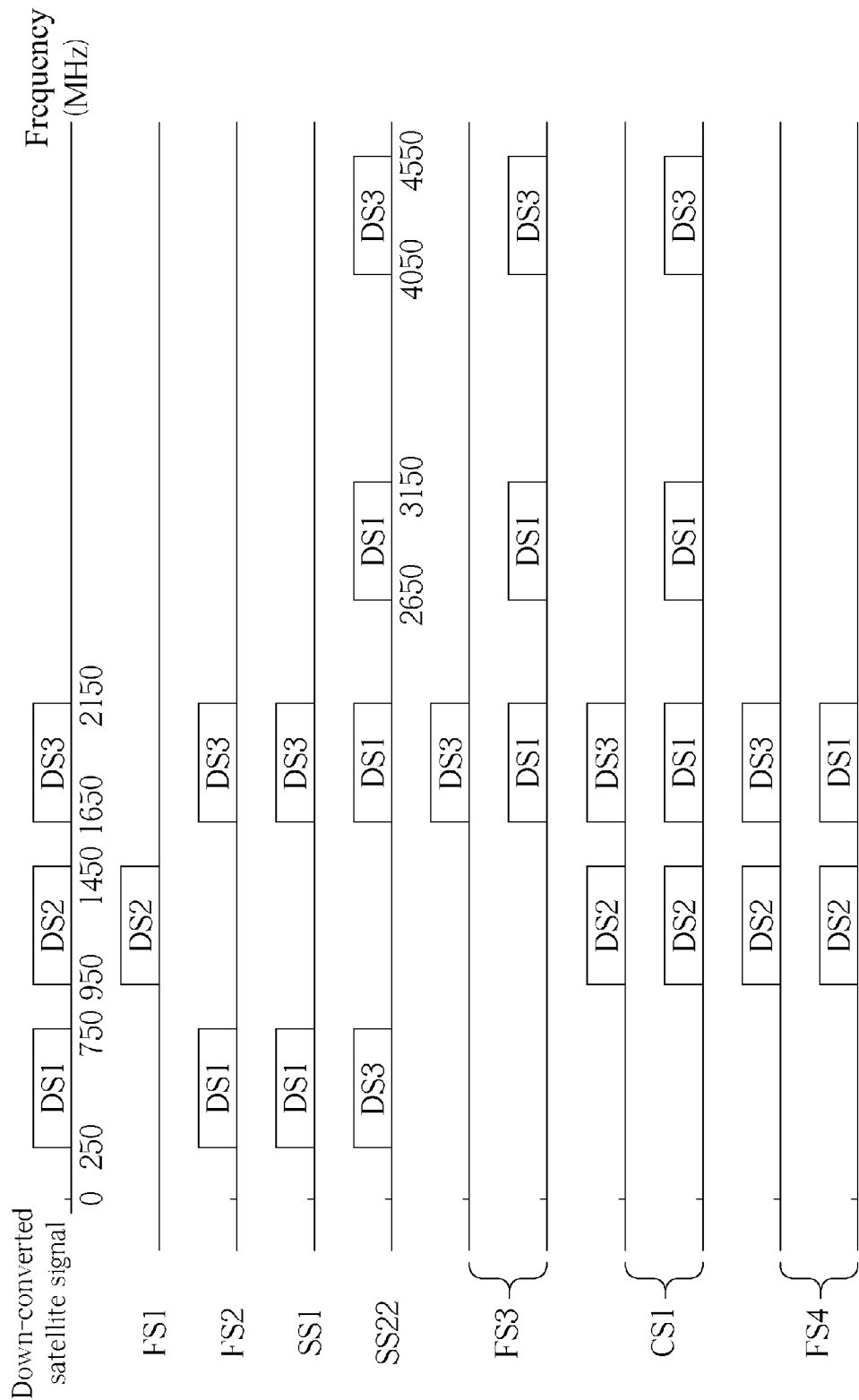
FIG. 5 is a spectrum diagram of the signals shown in FIG. 4.

Please refer to FIG. 4 together with FIG. 5. FIG. 5 is a spectrum diagram of the signals shown in FIG. 4. First, the band-pass filter BPF11 and the band-stop filter BSF11 are respectively adopted for performing a filtering action upon the down-converted satellite signal 100, so as to respectively generate a first filtered signal FS1 and a second filtered signal FS2. The first filtered signal FS1 consists of the second data signal DS2 located at the second frequency band FB2, while the second filtered signal FS2 consists of the first data signal DS1 located at the first frequency band FB1 as well as the third data signal DS3 located at the third frequency band FB3. The first power distributor 410 is coupled to the band-stop filter BSF11 for generating a first separation signal SS1 and a second separation signal SS2 according to the second filtered signal FS2. The signal compositions and their distribution positions of spectrum of the first separation signal SS1 and the second separation signal SS2 are the same as that of the second filtered signal FS2, except that their power is smaller than the power of the second filtered signal FS2.

After that, the local oscillator 440 provides a local oscillating signal LOS1 to the mixer 430. The mixer 430 then adjusts a frequency of the second separation signal SS2 according to the local oscillating signal LOS1 so as to generate an up-converted second separation signal SS22. In this embodiment, an oscillating frequency "fo" of the local oscillating signal LOS1 is set as 2400 MHz, but this is not meant to be a limitation of the present invention. After the mixer 430 mixes the local oscillating signal LOS1 with the second separation signal SS2, the second separation signal SS2 will be up-converted from its original frequency (for example, a center frequency of the second separation signal SS2 is represented by "fs") to the frequency (fo+fs), and a mirror signal of the second separation signal SS2 is generated at the frequency (fo−fs), as is also represented by the up-converted second separation signal SS2 shown in FIG. 5. In other words, the mixer 430 herein is used for up-converting the first data signal DS1 originally located at the first frequency band FB1 to the third frequency band FB3. Afterwards, the switch circuit 460, coupled to the first power distributor 410 as well as the mixer 430, selects one signal from the first separation signal SS1 and the up-converted second separation signal SS22 according to a selecting signal SEL11, and outputs an output signal $S_{OUT}$.

Furthermore, the micro-controller 470 is coupled to the switch circuit 460 and the local oscillator 440 for providing the selecting signal SEL11 to control switching actions of the switch circuit 460, and for providing a power supply V1 to the local oscillator 440. When the switch circuit 460 selects the up-converted second separation signal SS22 as the output signal $S_{OUT}$, the micro-controller 470 must simultaneously provide the power supply V1 to the local oscillator 440 so as to make the local oscillator 440 operate normally; and when the switch circuit 460 selects the first separation signal SS1 as the output signal $S_{OUT}$, the micro-controller 470 may power off the power supply V1 in order to save the power consumption of the local oscillator 440. Additionally, the high-pass filter HPF11 is coupled to the switch circuit 460 for executing a high-pass filtering upon the output signal $S_{OUT}$, (i.e., the first separation signal SS1 or the up-converted second separation signal SS22) to generate a third filtered signal FS3. That is to say, only signals having a frequency higher than the third frequency band FB3 are allowed to pass through the high-pass filter HPF11, as is also represented by the third filtered signal FS3 shown in FIG. 5.

Afterwards, the second power distributor 450 is coupled to the band-pass filter BPF11 as well as the high-pass filter HPF11, and merges the first filtered signal FS1 and the third filtered signal FS3 to generate a merged signal CS1. Finally, the low-pass filter LPF11 is coupled to the second power distributor 450, for performing a low-pass filtering upon the merged signal CS1 to generate a fourth filtered signal FS4. Since only signals having a frequency lower than the first frequency band FB1, the second frequency band FB2, and the third frequency band FB3 are allowed to pass through the low-pass filter LFP11, signals having a frequency higher than the third frequency band FB3 (such as the signal compositions generated by the mixer 430) can be filtered out, which is represented by the fourth filtered signal FS4 shown in FIG. 5. That is to say, the fourth filtered signal FS4 may consist of the second data signal DS2 located at the second frequency band FB2 as well as the third data signal DS3 located at the third frequency band FB3 (namely, the first output signal 210), or may consist of the second data signal DS2 located at the second frequency band FB2 as well as the first data signal DS1 located at the third frequency band FB3 (namely, the second output signal 220).

Figure 1:
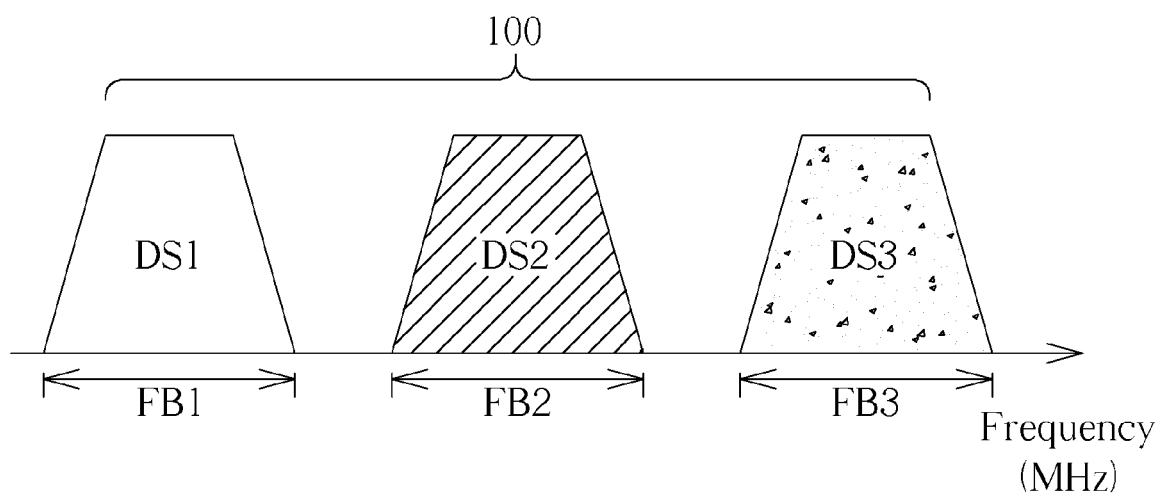
FIG. 1 is a spectrum diagram of a down-converted satellite signal.
Figure 2:
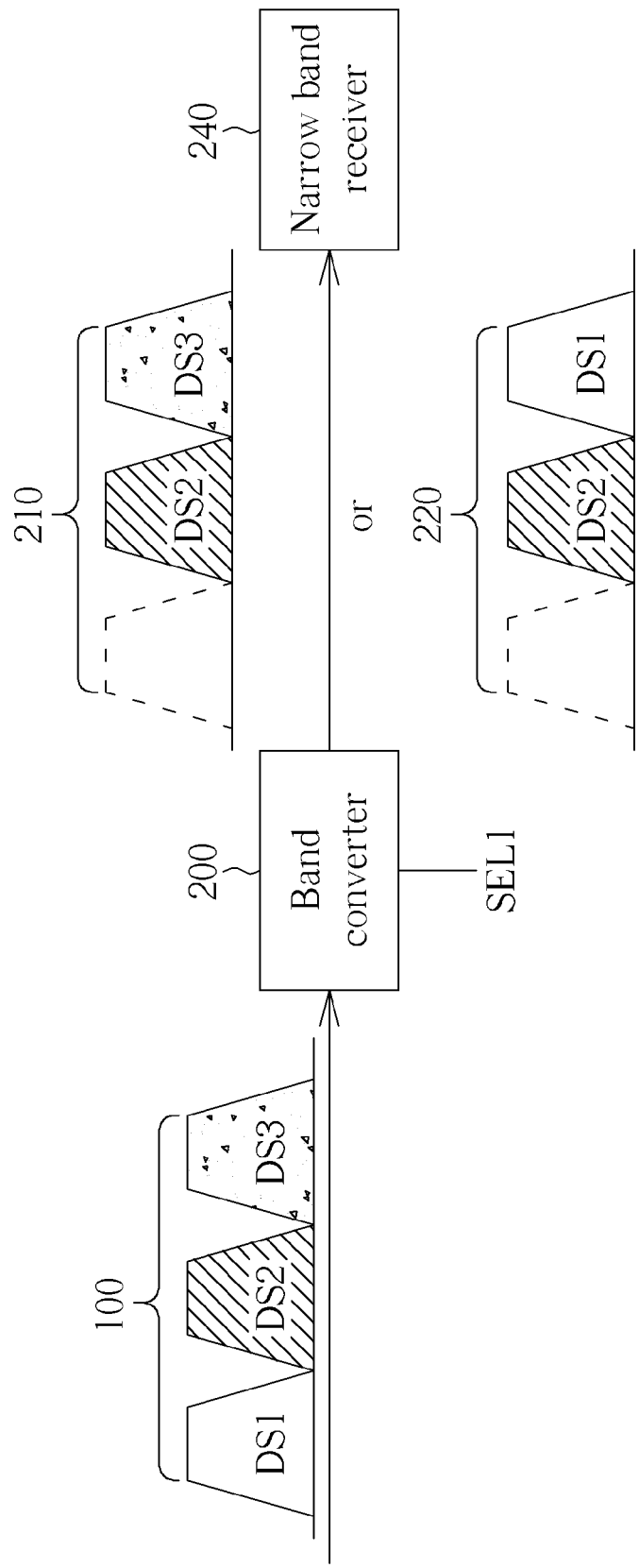
FIG. 2 is a diagram illustrating the down-converted satellite signal shown in FIG. 1 processed by a band converter.
Figure 3:
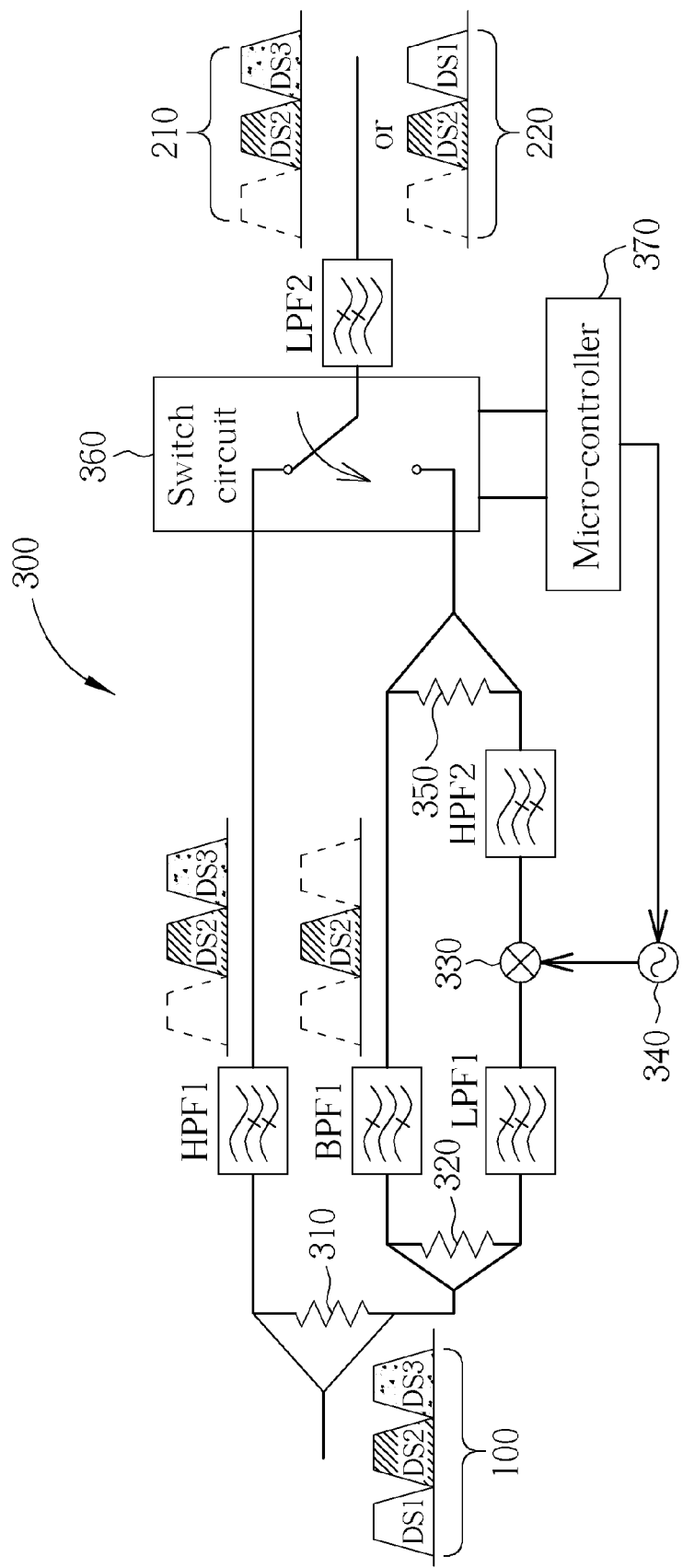
FIG. 3 is a diagram showing an architecture of a traditional B-band converter.

To make a long story short, the down-converted satellite signal 100 shown in FIG. 1 is received by the band converter 400 and is processed by its internal components, wherein the switch circuit 460 is used for selecting to output the first output signal 210 or the second output signal 220 to the back-end narrow band receiver (not shown).

What calls for special attention is that, in this embodiment, the low-pass filter LPF11 is disposed inside the band converter 400. If the back-end narrow band receiver is already equipped with a built-in low-pass filter or a built-in band-pass filter which only allows signals having a frequency lower than the upper edge of the third frequency band FB3 to pass through (that is, signals having a frequency higher than the upper edge of the third frequency band FB3 will be filtered out by the built-in low-pass filter or the built-in band-pass filter), the low-pass filter LPF11 is an optional element and can be omitted or can be replaced by other elements capable of achieving the same goal. The band converter 400 can be a B-band converter, but this in no way should be considered as limitations of the present invention. Please also note that, in other embodiments, the selecting signal SEL11 can be provided by a user. For example, the user can make choices through a remote controller. Hence, the micro-controller 470 is an optional element as well.

Be noted that, since the first power distributor 410, the mixer 430, the local oscillator 440, the switch circuit 460, and the micro-controller 470 mentioned in this embodiment occupy a few area, they can be easily implemented upon an identical integrated circuit. As a result, this integrated circuit can be directly manufactured in production lines for mass production, which can improve the manufacturing yield rate of products.

The band converter 400 disclosed in the present embodiment is provided with the following advantages of: circuit simplification, lower cost, improving signal quality of products, and achieving a goal of modular (chip-based) products. Four filters and two power distributors are required in the band converter 400. Therefore, a goal of reducing the size of products and saving cost can be achieved. In addition, because the band converter 400 has fewer components than the traditional B-band converter 300, transmission loss of signals can be reduced so as to improve signal quality of products. Moreover, the first power distributor 410, the mixer 430, the local oscillator 440, the switch circuit 460, and the micro-controller 470 of the band converter 400 can be implemented upon an identical integrated circuit, and this integrated circuit can be directly manufactured in production lines for mass production, which can improve the manufacturing yield rate of products.

Generally speaking, the B-band converter is with the use of a low-noise block down-converter (LNB) and an integrated receiver-decoder (IRD). The output signals of the LNB consist of: a Ka Lo-band signal located at 250~750 MHz (also called as a B band signal), a Ku band signal located at 950~1450 MHz, and a Ka Hi-band signal located at 1650~2150 MHz (also called as an A band signal). However, the input frequency range of the IRD is only 950~2150 MHz. The Ka Lo-band signal must be up-converted (from 250 MHz~750 MHz to 1650~2150 MHz) by means of a B-band converter first, and thus the Ka Lo-band signal can be received by the IRD.

Figure 6:
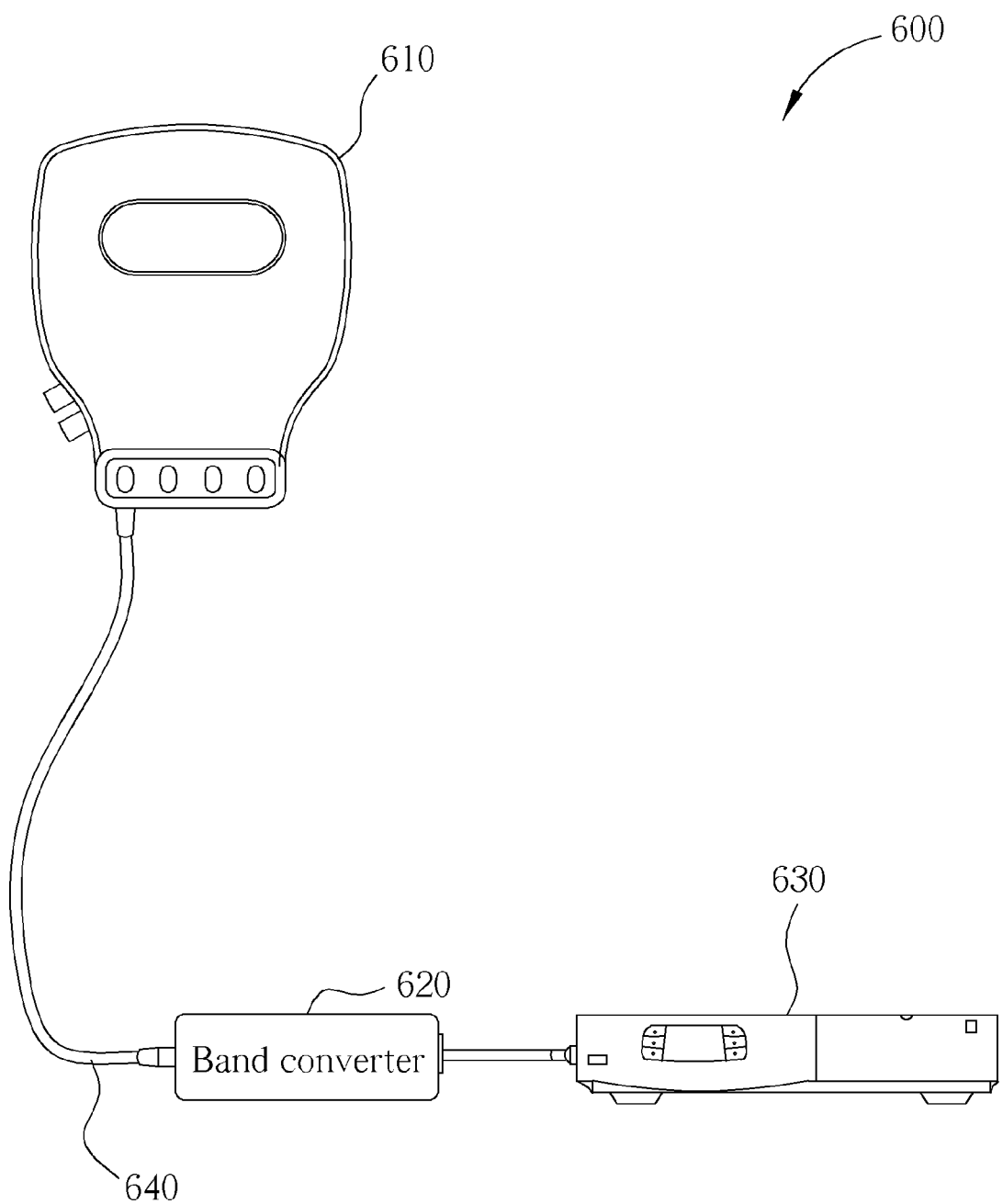
FIG. 6 is a diagram showing a satellite television system according to a first embodiment of the present invention.

Please refer to FIG. 6. FIG. 6 is a diagram showing a satellite television system 600 according to a first embodiment of the present invention. AS shown in FIG. 6, the satellite television system 600 consists of a LNB 610, a band converter 620, and an IRD 630. The LNB 610 receives a satellite signal, and then down-converts and amplifies it to generate a down-converted satellite signal, such as the down-converted satellite signal 100 shown in FIG. 1. The band converter 620 is coupled to the LNB 610 via a cable 640, for receiving the down-converted satellite signal. The band converter 620 herein can be implemented by the band converter 400 shown in FIG. 4 (or a varied embodiment of the band converter 400). The IRD 630 is coupled to the band converter 620 for receiving and decoding the signals (e.g. the fourth filtered signal FS4) outputted from the band converter 620. The IRD 630 herein means the narrow band receiver mentioned above.

Figure 7:
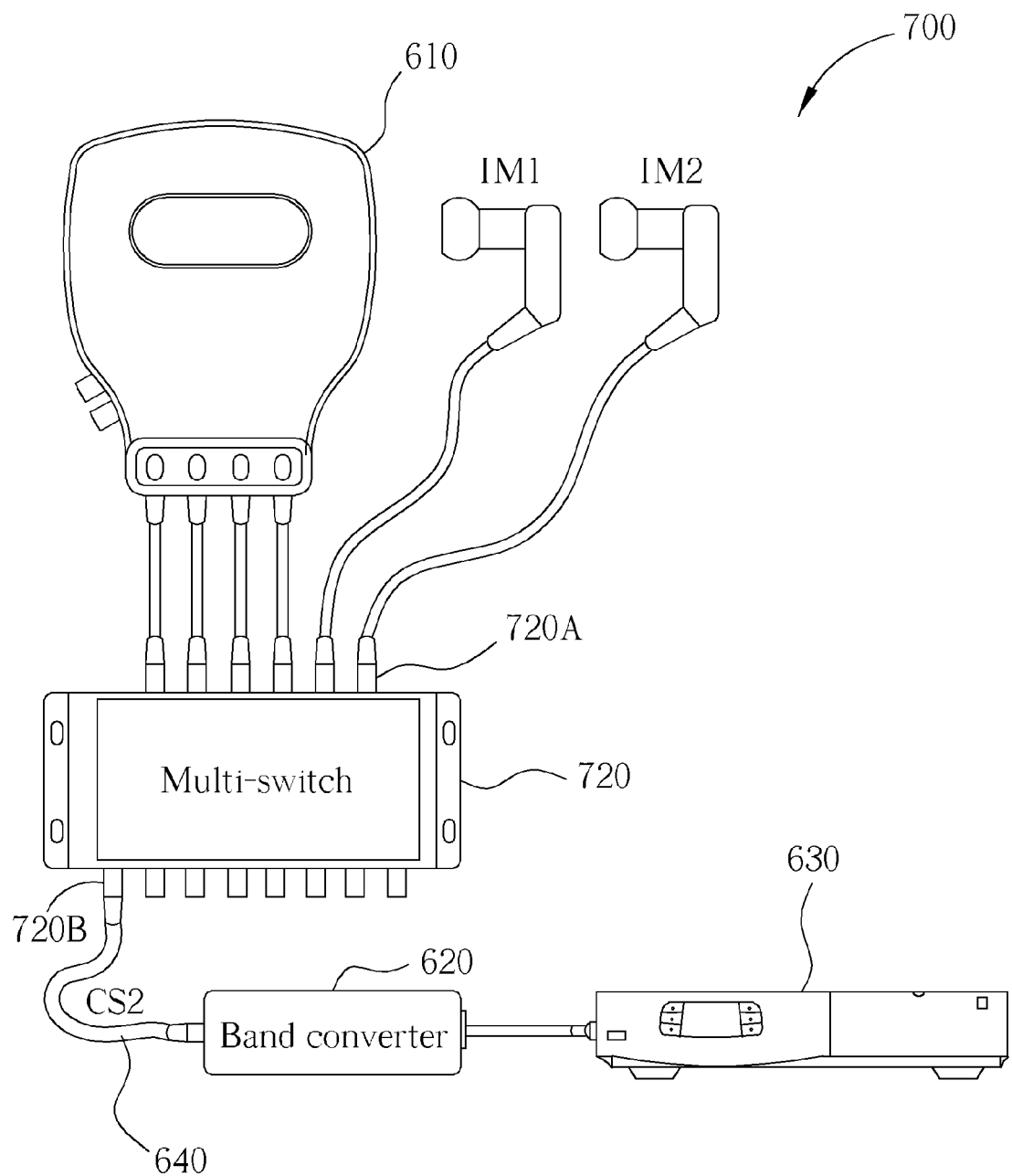
FIG. 7 is a diagram showing a satellite television system according to a second embodiment of the present invention.

Please refer to FIG. 7. FIG. 7 is a diagram showing a satellite television system 700 according to a second embodiment of the present invention. The architecture of the satellite television system 700 shown in FIG. 7 is similar to that of the satellite television system 600, and the difference between them is that the satellite television system 700 further includes a multi-switch 720, coupled between the LNB 610 and the band converter 620. The multi-switch 720 consists of a plurality of input ports 720A and a plurality of output ports 720B. The plurality of input ports 720A are used for receiving the down-converted satellite signal and a plurality of image signals (e.g. IM1 and IM2) and for merging them to generate a merged down-converted satellite signal (e.g. CS2); and one of the plurality of output ports 720B is used for simultaneously allocating the merged down-converted satellite signal CS2 to several users for their use.

The abovementioned embodiments are presented merely for describing the features of the present invention, and in no way should be considered to be limitations of the scope of the present invention. In summary, the present invention provides a band converter and a related satellite television system. The band converter disclosed in the present invention has streamlined circuits (for example, the amount of the power distributors and the filters are reduced) in order to reduce the product size and save cost. Moreover, because the band converter has fewer components than the traditional B-band converter, transmission loss of signals can be reduced to improve signal quality of products. In addition, the power distributor, the mixer, the local oscillator, the switch circuit, and the micro-controller can be implemented upon an identical integrated circuit, and this integrated circuit can be directly manufactured in production lines for mass production, which can improve the manufacturing yield rate of products.

Those skilled in the art will readily observe that numerous modifications and alterations of the device and method may be made while retaining the teachings of the invention.

What is claimed is:

1. A band converter used for receiving a down-converted input signal, the down-converted input signal having a first data signal located at a first frequency band, a second data signal located at a second frequency band, and a third data signal located at a third frequency band, the third frequency band being higher than the second frequency band, and the second frequency band being higher than the first frequency band, the band converter comprising:
    a band-pass filter, for performing a band-pass filtering upon the down-converted input signal to generate a first filtered signal, wherein the first filtered signal comprises the second data signal located at the second frequency band;
    a band-stop filter, for performing a band-stop filtering upon the down-converted input signal to generate a second filtered signal, wherein the second filtered signal comprises the first data signal located at the first frequency band and the third data signal located at the third frequency band;
    a first power distributor, coupled to the band-stop filter, for generating a first separation signal and a second separation signal according to the second filtered signal;
    a local oscillator, for providing a local oscillating signal;
    a mixer, coupled to the first power distributor and the local oscillator, for adjusting a frequency of the second separation signal according to the local oscillating signal so as to generate an up-converted second separation signal;
    a switch circuit, coupled to the first power distributor and the mixer, for selecting one signal from the first separation signal and the up-converted second separation signal according to a selecting signal, and for outputting an output signal;
    a high-pass filter, coupled to the switch circuit, for performing a high-pass filtering upon the output signal to generate a third filtered signal;
    a second power distributor, coupled to the band-pass filter and the high-pass filter, for merging the first filtered signal and the third filtered signal to generate a merged signal; and
    a low-pass filter, coupled to the second power distributor, for performing a low-pass filtering upon the merged signal to generate a fourth filtered signal.

2. The band converter of claim 1, wherein the first frequency band falls on 250~750 MHz, the second frequency band falls on 950~1450 MHz, and the third frequency band falls on 1650~2150 MHz.

3. The band converter of claim 1, wherein the fourth filtered signal comprises the second data signal located at the second frequency band and the third data signal located at the third frequency band.

4. The band converter of claim 1, wherein the fourth filtered signal comprises the second data signal located at the second frequency band and the first data signal located at the third frequency band.

5. The band converter of claim 1, further comprising:
    a micro-controller, coupled to the switch circuit and the local oscillator, for providing the selecting signal to the switch circuit, and for providing a power supply to the local oscillator.

6. The band converter of claim 5, wherein the first power distributor, the local oscillator, the mixer, the switch circuit, and the micro-controller are disposed on an identical integrated circuit.

7. The band converter of claim 1, wherein the band converter is applied to a satellite television system, and the down-converted input signal is a down-converted satellite signal.

8. A band converter used for receiving a down-converted input signal, the down-converted input signal having a first data signal located at a first frequency band, a second data signal located at a second frequency band, and a third data signal located at a third frequency band, the third frequency band being higher than the second frequency band, and the second frequency band being higher than the first frequency band, the band converter comprising:
    a band-pass filter, for performing a band-pass filtering upon the down-converted input signal to generate a first filtered signal, wherein the first filtered signal comprises the second data signal located at the second frequency band;
    a band-stop filter, for performing a band-stop filtering upon the down-converted input signal to generate a second filtered signal, wherein the second filtered signal comprises the first data signal located at the first frequency band and the third data signal located at the third frequency band;

a first power distributor, coupled to the band-stop filter, for generating a first separation signal and a second separation signal according to the second filtered signal;

a local oscillator, for providing a local oscillating signal;

a mixer, coupled to the first power distributor and the local oscillator, for adjusting a frequency of the second separation signal according to the local oscillating signal so as to generate an up-converted second separation signal;

a switch circuit, coupled to the first power distributor and the mixer, for selecting one signal from the first separation signal and the up-converted second separation signal according to a selecting signal, and for outputting an output signal;

a high-pass filter, coupled to the switch circuit, for performing a high-pass filtering upon the output signal to generate a third filtered signal; and a second power distributor, coupled to the band-pass filter and the high-pass filter, for merging the first filtered signal and the third filtered signal to generate a merged signal.

9. The band converter of claim 8, wherein the first frequency band falls on 250~750 MHz, the second frequency band falls on 950~1450 MHz, and the third frequency band falls on 1650~2150 MHz.

10. The band converter of claim 8, further comprising:

a micro-controller, coupled to the switch circuit and the local oscillator, for providing the selecting signal to the switch circuit, and for providing a power supply to the local oscillator.

11. The band converter of claim 10, wherein the first power distributor, the local oscillator, the mixer, the switch circuit, and the micro-controller are disposed on an identical integrated circuit.

12. The band converter of claim 8, wherein the band converter is applied to a satellite television system, and the down-converted input signal is a down-converted satellite signal.

13. The band converter of claim 12, wherein the band converter is a B-band converter.

14. A satellite television system, comprising:

a low-noise block down-converter (LNB), for receiving a satellite signal and for down-converting and amplifying it to generate a down-converted satellite signal, the down-converted satellite signal having a first data signal located at a first frequency band, a second data signal located at a second frequency band, and a third data signal located at a third frequency band, the third frequency band being higher than the second frequency band, and the second frequency band being higher than the first frequency band;

a band converter, coupled to the LNB, for receiving the down-converted satellite signal, the band converter comprising:

a band-pass filter, for performing a band-pass filtering upon the down-converted input signal to generate a first filtered signal, wherein the first filtered signal comprises the second data signal located at the second frequency band;

a band-stop filter, for performing a band-stop filtering upon the down-converted input signal to generate a second filtered signal, wherein the second filtered signal comprises the first data signal located at the first frequency band and the third data signal located at the third frequency band;

a first power distributor, coupled to the band-stop filter, for generating a first separation signal and a second separation signal according to the second filtered signal;

a local oscillator, for providing a local oscillating signal;

a mixer, coupled to the first power distributor and the local oscillator, for adjusting a frequency of the second separation signal according to the local oscillating signal so as to generate an up-converted second separation signal;

a switch circuit, coupled to the first power distributor and the mixer, for selecting one signal from the first separation signal and the up-converted second separation signal according to a selecting signal, and for outputting an output signal;

a high-pass filter, coupled to the switch circuit, for performing a high-pass filtering upon the output signal to generate a third filtered signal;

a second power distributor, coupled to the band-pass filter and the high-pass filter, for merging the first filtered signal and the third filtered signal to generate a merged signal; and a low-pass filter, coupled to the second power distributor, for performing a low-pass filtering upon the merged signal to generate a fourth filtered signal; and an integrated receiver-decoder (IRD), coupled to the band converter, for receiving the fourth filtered signal and for decoding the fourth filtered signal.

15. The satellite television system of claim 14, further comprising:

a multi-switch, coupled between the LNB and the band converter, the multi-switch comprising a plurality of input ports and a plurality of output ports, wherein the plurality of input ports are used for receiving the down-converted satellite signal and a plurality of image signals and for merging them to generate a merged down-converted satellite signal, and one of the plurality of output ports is used for allocating the merged down-converted satellite signal to the band converter.

16. The satellite television system of claim 14, wherein the first frequency band falls on 250~750 MHz, the second frequency band falls on 950~1450 MHz, and the third frequency band falls on 1650~2150 MHz.

17. The satellite television system of claim 14, wherein the fourth filtered signal comprises the second data signal located at the second frequency band and the third data signal located at the third frequency band.

18. The satellite television system of claim 14, wherein the fourth filtered signal comprises the second data signal located at the second frequency band and the first data signal located at the third frequency band.

19. The satellite television system of claim 14, further comprising:

a micro-controller, coupled to the switch circuit and the local oscillator, for providing the selecting signal to the switch circuit, and for providing a power supply to the local oscillator.

20. The satellite television system of claim 19, wherein the first power distributor, the local oscillator, the mixer, the switch circuit, and the micro-controller are disposed on an identical integrated circuit.

* * * * *